United States Patent [19]

Uchida

[11] 4,122,541

[45] Oct. 24, 1978

[54] NON-VOLATILE MEMORY DEVICE

[75] Inventor: Yukimasa Uchida, Yokohama, Japan

[73] Assignee: Tokyo Shibaura Electric Company, Limited, Kawasaki, Japan

[21] Appl. No.: 717,668

[22] Filed: Aug. 25, 1976

[30] Foreign Application Priority Data

Aug. 29, 1975 [JP] Japan ................................ 50-104076

[51] Int. Cl.² ...................... G11C 11/40; G11C 8/00
[52] U.S. Cl. .................................... 365/154; 365/184; 365/238
[58] Field of Search ................... 340/173 R; 307/279; 365/184, 185, 154, 189, 230, 238

[56] References Cited

U.S. PATENT DOCUMENTS

| | | | |
|---|---|---|---|
| 3,579,204 | 5/1971 | Lincoln | 365/184 |
| 3,636,530 | 1/1972 | Mark et al. | 365/184 |
| 3,651,492 | 3/1972 | Lockwood | 340/173 R |
| 3,676,717 | 7/1972 | Lockwood | 365/184 X |
| 3,699,535 | 10/1972 | Klein | 340/172.5 |
| 3,706,976 | 12/1972 | Oleksiak | 365/184 |
| 3,774,176 | 11/1973 | Stein et al. | 340/173 R |
| 3,895,360 | 7/1975 | Cricchi et al. | 340/173 R |
| 4,044,343 | 8/1977 | Uchida | 365/184 |

*Primary Examiner*—Bernard Konick
*Assistant Examiner*—Donald McElheny
*Attorney, Agent, or Firm*—Cushman, Darby & Cushman

[57] ABSTRACT

A memory apparatus comprises a plurality of memory cells each having a bistable circuit comprising a pair of field effect transistors, a pair of switching transistors connected between a power supply and each output terminal of said paired field effect transistors, and a plurality of pairs of variable threshold insulated gate field effect transistors connected in parallel with the pair of switching transistors, the variable threshold insulated gate field effect transistors in pair constituting a non-volatile memory cell element, and a plurality of gate control lines connected in common to the gates of the paired variable threshold insulated gate field effect transistors.

4 Claims, 14 Drawing Figures

NON-VOLATILE MEMORY DEVICE

BACKGROUND OF THE INVENTION

This invention relates to a memory apparatus using insulated gate field effect transistors which constitute nonvolatile memory cell elements.

A nonvolatile memory cell constituted of variable threshold insulated gate field effect transistors (hereinafter referred to merely as MISFET's) having a specific gate structure retains its memory content even when a power supply is interrupted. A memory apparatus is well known in which such a nonvolatile memory cell constituted of MISFET's is used for each volatile memory flip-flop of an ordinary memory and when a power supply is interrupted a memory content on a volatile memory flip-flop is transferred to the nonvolatile memory cell. Such a conventional memory apparatus is generally designed to store one-bit information per memory cell and it is therefore impossible to independently store a plurality of information in one memory cell.

SUMMARY OF THE INVENTION

This invention relates to the incorporation of a nonvolatile memory cell element into an ordinary main memory cell and in particular to an improved memory apparatus capable of simultaneously storing a plurality of mutually different information in a single memory cell.

According to this invention there is provided a memory apparatus comprising a plurality of memory cells each having a power supply terminal, a bistable circuit constituted of at least one pair of field effect transistors and a plurality of pairs of variable threshold field effect transistors connected between the power supply terminal and the respective output terminals of the bistable circuit, each pair of the variable threshold field effect transistors constituting one nonvolatile memory cell element, and a plurality of gate control lines connected to the gates of said respective pairs of variable threshold field effect transistors constituting the nonvolatile memory cell elements in each of said memory cells.

DETAILED DESCRIPTION OF THE INVENTION

Figure 1:
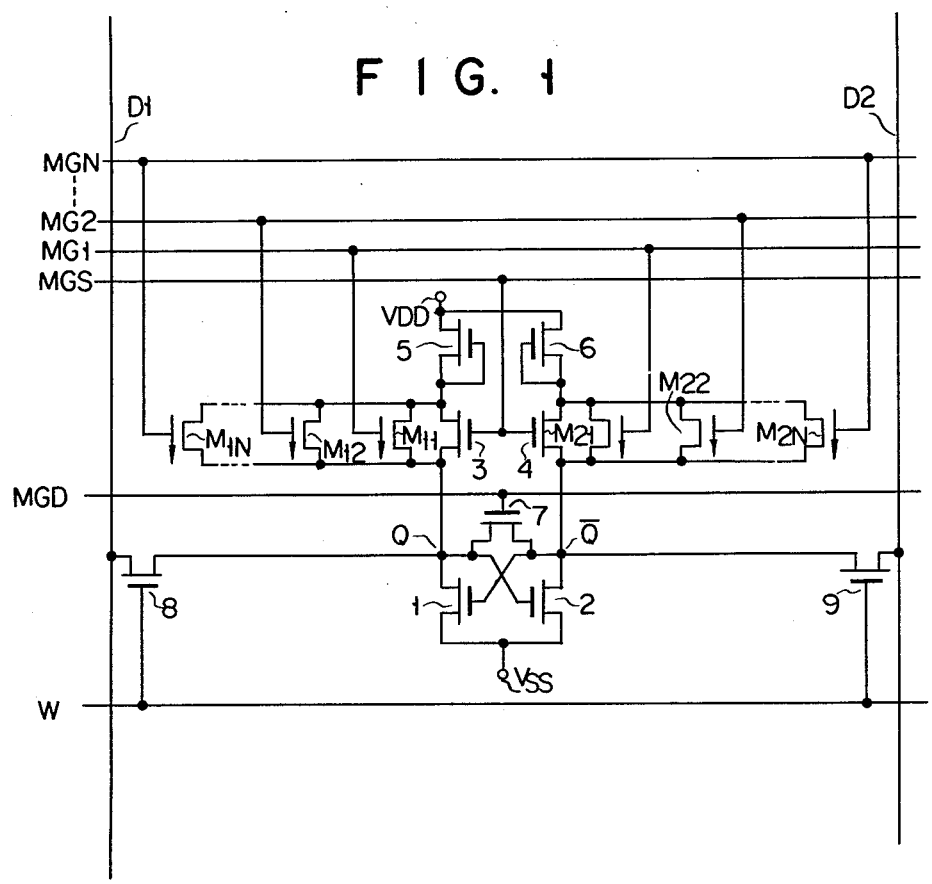
FIG. 1 is a circuit diagram of a memory cell used in a memory apparatus according to one embodiment of this invention.

FIG. 1 shows a circuit showing a memory cell used in a memory apparatus according to one embodiment of this invention. The memory cell includes a flip-flop circuit having MOSFET's 1 and 2 used as a driver transistor. The gate and drain of the MOSFET 1 are respectively connected to the drain and gate of the MOSFET 2, and the sources of the MOSFET 1 and 2 are connected to a power supply $V_{SS}$ (for example, 0V). The drains of the MOSFET's 1 and 2 are used as output terminals Q and $\bar{Q}$ of the flip-flop circuit. The drain of the MOSFET 1 is seriallyconnected through a switching FET 3 and load MOSFET 5 to a power supply $V_{DD}$ (for example, −20V) and the drain of the MOSFET 2 is serially connected through a switching FET 4 and load MOSFET 6 to the power supply $V_{DD}$.

A plurality of MOSFET's $M_{11}$ to $M_{1N}$ are connected in parallel with the switching FET 3 and a plurality of MNOSFET's $M_{21}$ to $M_{2N}$ are connected in parallel with the switching FET 4. The MNOSFET's $M_{11}$ to $M_{1N}$ are respectively combined with the MNOSFET's $M_{21}$ to $M_{2N}$ to provide nonvolatile memory cell elements $M_1$ to $M_N$. The gates of the paired MNOSFET's $M_{11}$ and $M_{21}$, $M_{12}$ and $M_{22}$ ... $M_{1N}$ and $M_{2N}$ are connected to gate control lines $M_{G1}$, $M_{G2}$ ... $M_{GN}$, respectively.

The gates of the paired switching FET's 3 and 4 are connected to the gate control lines $M_{GS}$. A MOSFET 7 is connected between the gates of the paired driver transistors 1 and 2, and has a gate connected to a gate control line MGD. The drains of the FET's 1 and 2, constituting the flip-flop circuit, are connected to data lines D1 and D2 respectively through MOSFET's 8 and 9 which function as switching elements. The data lines D1 and D2 transmit respective signals inverted with respect to each other. The gates of the FET's 8 and 9 are connected to a word line W. When the FET's 8 and 9 are rendered conductive through the word line W, the output terminals Q and $\bar{Q}$ of the flip-flop circuit are electrically coupled respectively through the MOSFET's 8 and 9 to the data lines D1 and D2.

The memory cell of the memory apparatus according to this invention comprises an flip-flop circuit having the driver transistors 1 and 2 and load MOSFET's 5 and 6, switching MOSFET's 3 and 4, MNOSFET's $M_{11}$ to $M_{1N}$ and $M_{21}$ to $M_{2N}$, and MOSFET 7.

The operation of the memory device in FIG. 1 will be explained below by referring to FIGS. 2 and 3.

In this example, let a potential 0V be a high or H level voltge and a potential −15V be a low or L level voltage, and suppose that the threshold voltages of the MOSFET's 1, 2, 3, 4 and 7 are −1.5 V and the threshold voltage of the load MOSFET's 5 and 6 are +5V. Then, the threshold voltages of the MNOSFET's $M_{11}$ to $M_{1N}$ and $M_{21}$ to $M_{2N}$ show a hysteresis characteristic shown in FIG. 2.

Figure 2:
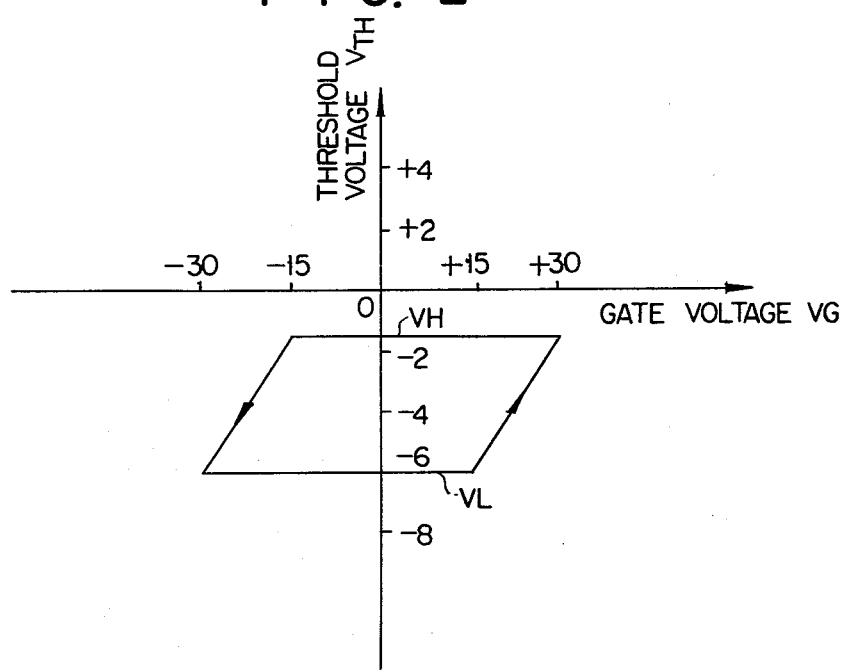
FIG. 2 is a characteristic curve showing the threshold values of field effect transistors shown in FIG. 1.
Figure 3:
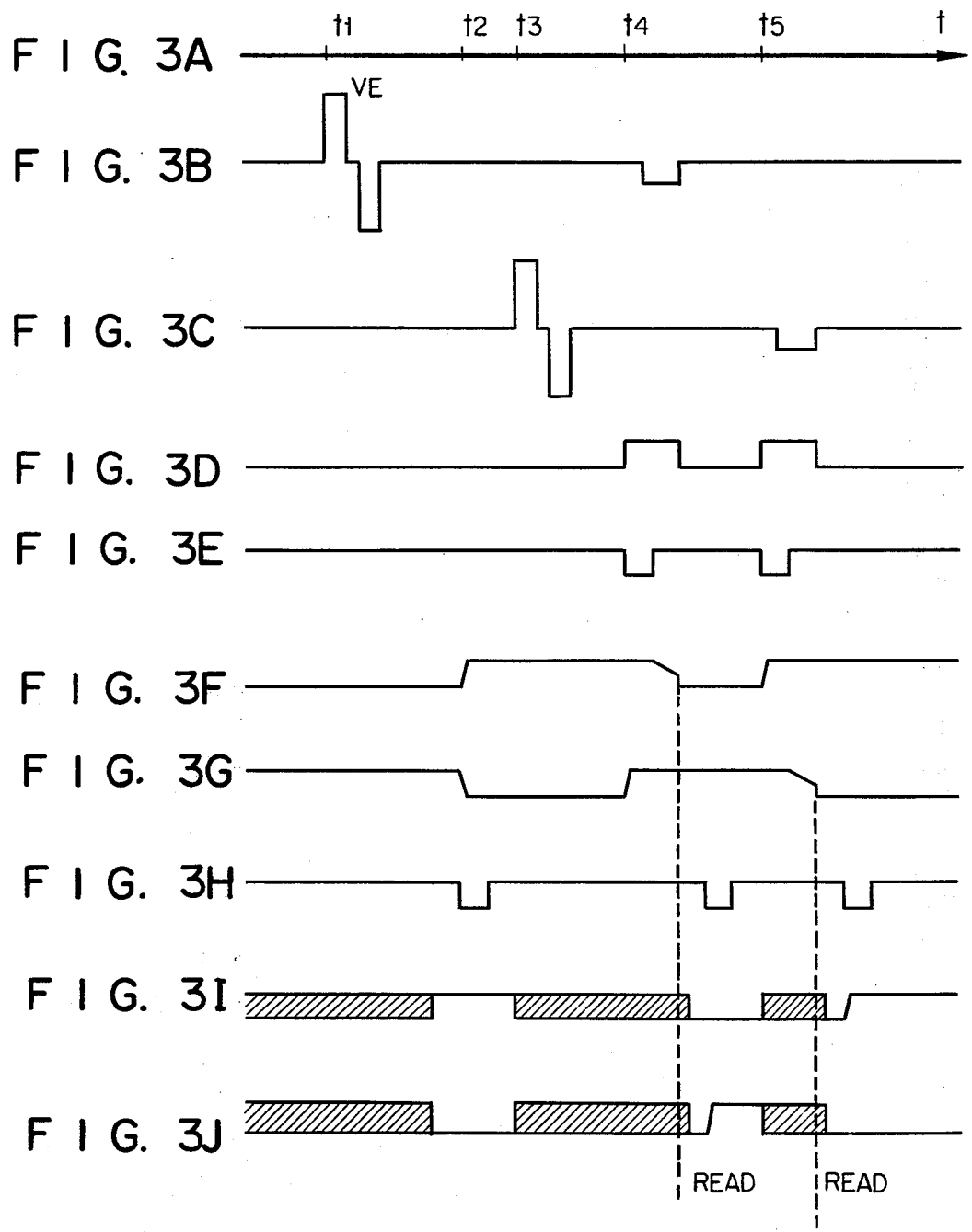
FIGS. 3A to 3J show a time relation of signals generated in some parts of the memory cell in FIG. 1.

In FIG. 2 an effective gate application voltage $V_G$ is plotted as an abscissa and a threshold voltage V$th$ as a coordinate. When a pulse having, for example, an amplitude $V_E$ of +30V with respect to the substrate voltage and a pulse width $P_W$ of 10 μ sec is applied to the gates of the MNOSFET's constituting the nonvolatile memory cell element, the threshold voltage V$th$ is varied in a positive direction and shows a high level voltage $V_H$ of, for example, −1.5V. When a pulse $V_W$ with a pulse width $P_W$ of 10 μ sec and an amplitude of −30V with respect to the source voltage is applied to the gates of the MNOSFET's, the threshold voltage V$th$ is varied in a negative direction and shows a low voltage $V_L$ of, for example, −6V. In this way, the threshold voltage of the FET shows a hysteresis characteristic with respect to the gate voltage variation of the MNOSFET and the threshold voltage is held even after the bias voltage to the MNOSFET has been removed.

For simplicity in explanation, the relation between digital information and potentials at some points of the memory circuit is determined as follows.

With potentials of the output terminals Q and $\bar{Q}$ of the flip-flop circuit at low and high potential levels, respectively, the digital information of the flip-flop circuit is "1" and with potentials of the output terminals Q and $\bar{Q}$ of the flip-flop circuit at high and low levels, respectively, the digital information of the flip-flop circuit is "0."

The nonvolatile memory cell element is adapted to store one-bit digital informaion by its paired MNOSFET's. When, for example, the threshold voltage of the MNOSFET $M_{1i}$ of the I*th* nonvolatile memory cell element $M_i$ is at the high level $V_H$ and the corresponding MNOSFET $M_{2i}$ is at the low level $V_L$, the memory cell element $M_i$ stores informaion "1" and when the threshold voltage of the MNOSFET $M_{1i}$ is at the low voltage level $V_H$ and the threshold voltage of the MNOSFET $M_{2i}$ is at the high level, the memory element $M_i$ stores information "0." When, however, the MNOSFET's $M_{1i}$ and $M_{2i}$ are both at the high level, the memory element $M_i$ is in an "erased" state. The states of the memory element are as follows.

| Voltage levels on output terminals: Q and $\bar{Q}$ | | Threshold value levels of MNOSFET's: $M_{1i}$ $M_{2i}$ | | State of memory cell element $M_i$ |
|---|---|---|---|---|
| L | H | $V_H$ | $V_L$ | "1" |
| H | L | $V_L$ | $V_H$ | "0" |
| | | $V_H$ | $V_H$ | erased |

The operation of the memory cell in FIG. 1 will be explained below by referring to FIGS. 3A to 3J.

FIG. 3A shows the time axis of signals in FIGS. 3B to 3J. Suppose that at time t1 the flip-flop circuit has information "1," that is, a voltage on the Q terminal of the flip-flop circuit is at the low level as shown in FIG. 3F and a voltage on the $\bar{Q}$ terminal of the flip-flop circuit is at the high level as shown in FIG. 3G. At this time, a voltage on the control line MGS connected to the gates of the switching FET's 3 and 4 is held at the low level as shown in FIG. 3D and a voltage on the gate control line MGD connected to the gate of the MOSFET 7 is held at the high level as shown in FIG. 3E. Since the threshold voltages of the FET's 3 to 4 and 7 are at a level of −1.5V, the FET's 3 and 4 are rendered conductive and the FET 7 is rendered nonconductive.

The information "1" stored in the flip-flop circuit is written in the following way into the paired MNOS- FET's $M_{11}$ and $M_{21}$ in the first nonvolatile memory cell element $M_1$.

As shown in FIG. 3B, a positive pulse with an amplitude $V_E$ of +30V and pulse width of 10 μ sec is applied to the gate control line $MG_1$, followed by application of a negative pulse with an amplitude $V_W$ of −30V and pulse width of 10 μ sec. As the memory content of the flip-flop circuit is "1," an output on the Q terminal of the flip-flop circuit is −15V and an output on the $\bar{Q}$ terminal of te flip-flop circuit QV. When in this state the positive pulse is applied to the control line $MG_1$, an effective voltage applied to a gate insulator, i.e., the gate-substrate voltage of the MNOSFET $M_{11}$ is at a level of 30V and the gate-substrate voltage of the MNOSFET $M_{21}$ is at a level of 30V. In consequence, the threshold values of the MNOSFET's $M_{11}$ and $M_{21}$ are both at the high level $V_H$ and the memory element $M_1$ is in the "erased" state.

When with the memory element in the erased state a negative pulse is applied to the control line $MG_1$, the gate-source voltage of the MNOSFET 11 is −15V and an applied effective gate voltage is −15V. In consequence, the threshold voltage of the MNOSFET $M_{11}$ is held at a high level $V_H$ without variation. By the "applied effective gate voltage" is meant a voltage applied to a gate insulating element, that is, either a potential difference between the gate and the substrate or in the presence of a channel a potential difference between the gate and the channel. Since, on the other hand, the source potential of the MNOSFET $M_{21}$ is 0V, the applied effective gate voltage $V_G$ is held at a level of −30V and the threshold value of the FET $M_{21}$ is shifted from the high voltage level $V_H$ to the low voltage level $V_L$. In this state, the threshold value of the MNOSFET $M_{11}$ is at the high voltge level $V_H$ and the threshold value of the MNOSFET $M_{21}$ is at the low voltage level $V_L$, thus causing information "1" to be stored in the memory cell element $M_1$. In this way, a write pulse whose amplitude varies from the ositive to the negative level is applied to the MNOSFET's $M_{11}$ and $M_{21}$ and the memory content "1" of te flip-flop circuit is written into the first memory cell element $M_1$. In this case, the FET's 1 and 2 undergo no change and the flip-flop circuit maintains the memory content "1."

At time $t_2$ a voltage on the word line W is at the low level as shown in FIG. 3H, a voltage on the digit line D1 is at the high level as shown in FIG. 3I and a voltage on the digit line D2 is at the low level as shown in FIG. 3J. Accordingly, the memory content of the flip-flop circuit becomes "0." Explanation will now be made of the case where the information "0" of the flip-flop circuit is written into the second nonvolatile memory cell element $M_2$ which comprises MNOSFET's $M_{12}$ and $M_{22}$.

As shown in FIG 3C, at time $t3$ a write pulse of a positive and a negative pulse as explained in connection with FIG. 3D is applied to the gate control line $MG_2$. When a positive pulse is applied to the gate of MNOSFET's $M_{12}$ and $M_{22}$, the threshold values of the MNOSFET's $M_{12}$ and $M_{22}$ take high levels $V_H$, causing the memory cell element $M_2$, i.e., the paired MNOSFET's $M_{112}$ and $M_{22}$ to be set into the "erased" state. Then, a negative pulse is applied to the gate of the MNOSFET's $M_{12}$ and $M_{22}$, the gate-source voltage of the MNOSFET $M_{12}$ becomes a voltage level of −30V and the threshold voltage of the FET $M_{12}$ becomes a low voltage level $V_L$. Since on the other hand, a voltage on the terminal $\bar{Q}$ of the flip-flop circuit is −15V, an applied effective gate voltage $V_G$ becomes a voltage level of −15V and the threshold voltage of the MNOSFET $M_{22}$ continues to be maintained at a high level $V_H$. In consequence, information "0" is written in the memory cell element $M_2$. Even after the informaion writing, the flip-flop circuit continues to be maintained at the "0" state.

The content thus written into the nonvolatile memory cell element is read in the following way as required.

For example, as shown in FIGS. 3D and 3E, at time $t4$ a voltage on the control line MGS is made at a high level and a voltage on the control line MGS is made at a low level, so that the switching FET's and 4 are rendered nonconductive and the FET 7 is rendered conductive. By the conduction of the FET 7 a voltage on the Q terminal and on the $\bar{Q}$ terminal of the flip-flop circuit becomes a voltage of −1.5V (in this embodiment), i.e., a voltage lower than the power supply voltage $V_{SS}$ by the threshold volage of the FET's 1 and 2. In this state, a readout voltage $V_R$ of, for example, −5V as shown in FIG. 3B is applied to the gate control line $MG_1$ for MNOSFET's $M_{11}$ and $M_{21}$ and, as shown in FIG. 3E, a potential on the control line MGD is converted to a high level. When a potential on the control line MGD becomes a high level, the FET 7 is rendered nonconductive. Since the switching FET's 3 and 4 are maintained in the nonconductive state, a potential on the Q terminal and on the $\bar{Q}$ terminal of the flip-flop circuit is determined according to the memory content of the MNOSFET's $M_{11}$ and $M_{21}$. As already mentioned above, at time $t1$ information "1" is written into the memory cell element $M_1$ and MNOSFET's $M_{11}$ and $M_{21}$ have high and low voltage levels, i.e., threshold voltages of $-1.5V$ and $-6V$, respectively. When in this state a readout voltage $V_R$ of $-5V$ is applied to the gate of the MNOSFET's $M_{11}$ and $M_{21}$ through the control line MG1, the MNOSFET $M_{11}$ is rendered conductive and the MNOSFET $M_{21}$ is maintained in the nonconductive state. By the conduction of the MNOSFET $M_{11}$ a potential on the output terminal Q becomes equal to a voltage of $-3.5V$ obtained by substracting the $-1.5V$ threshold voltage of the MNOSFET from the $-5V$ voltage of the control line $MG_1$. Since the MNOSFET $M_{21}$ is in the nonconductive state, a potential on the $\bar{Q}$ terminal of te flip-flop circuit remains equal to the $-1.5V$ threshold voltage of the FET1. Since a potential on the Q terminal of the flip-flop circuit is $-3.5V$ and a potential on the $\bar{Q}$ terminal of the flip-flop circuit is 1.5V, the FET1 is rendered nonconductive and the FET 2 is rendered conductive. When a potential on the control line MG1 is at the level of 0V and a potential on the control line MGS is made at the lower level, the switching FET's 3 and 4 are again rendered ON. As a result, the flip-flop circuit is operated with the FET 1 ON and the FET 2 OFF. Because in this state the Q terminal of the flip-flop circuit is maintained at the low voltage level and the $\bar{Q}$ terminal of the flip-flop circuit at the high voltage level, the information of the flip-flop circuit is "1" and "1" and at time $t1$ the information "1" of the flip-flop circuit is retained.

Information fed from the memory cell element $M_1$ to the flip-flop circuit is read out from the digit lines D1 and D2 as required. That is, when as shown in FIG. 3H a low level voltage is applied to the word line W with th digit lines D1 and D2 precharged previously at the low voltage level, the FET's 8 and 9 are rendered conductive. In this case, a potential on the output terminal $\bar{Q}$ is at a high level and in consequence a potential on the digit line D2 is changed from a low to a high level. With the potential on the word line W made at a low lvel, as shown in FIGS. 3I and 3J, the potential on the digit line D1 shows a low level and the potential on the digit line D2 a high level. In this way, the informaion "1" of the flip-flop circuit is read out through the digit line D1 and D2 and when the potential on the word line W regains a high level the readout operation is completed.

Information "0" stored in the memory cell element $M_2$ is read out in the same manner as the information "1" stored in the memory cell element $M_1$. That is, with high and low voltages respectively applied to the control lines MGS and MGD as shown in FIGS. 3D and 3E, a $-5V$ readout voltage is applied to the control line MG2 as shown in FIG. 3C. In this case, a high level voltage appears on the Q terminal of the flip-flop circuit shown in FIG. 3F and a low level voltage on the $\bar{Q}$ terminal of te flip-flop circuit as shown in FIG. 3G. The voltage on the Q terminal and voltage on the $\bar{Q}$ terminal of the flip-flop circuit are coupled to the digit lines D1 and D2, respectively, by applying a low lvel voltage to the word line W as shown in FIG. 3H. That is, the potential on the digit line D1 shows a low level as shown in FIG. 3I and the potential on th digit line D2 a high level as shown in FIG. 3J. In consequence, information "0" stored in the memory cell element $M_2$ is read out through the digit lines D1 and D2. A time width as indicated by a hatched area in FIGS. 3I and 3J shows a time period in which the potential on the digit lines D1 and on the digit line D2 is indefinite, i.e., a data is invalid.

Although in the readout operation the magnitude of the readout voltage $V_R$ is selected between the threshold values $V_H$ and $V_L$ of the MNOSFET as shown in FIG. 2, it may be set to be a voltage somewhat lower than the threshold voltage $V_L$. In this case, the paired MNOSFET's are both rendered conductive. Voltages on the Q terminal and on the $\bar{Q}$ terminal of the flip-flop circuit can be determined, by means of the conductivity difference of he paired MNOSFET's according to information stored in the nonvolatile memory cell element comprising the paired MNOSFET's.

In the above-mentioned embodiment, the FET 7 is rendered conductive immediately before the readout operation, causing a potential on the Q terminal and $\bar{Q}$ terminal of the flip-flop circuit to be made substantially at a zero volt. Since, the potential on the output terminal Q and on the output terminal $\bar{Q}$ gradually approaches a zero level, however, if sufficiently long time can be taken before the readout operation, it is not necessary that the potential on the Q terminal and $\bar{Q}$ terminal of te flip-flop circuit be forcedly made at a zero level by causing the FET 7 to be rendered conductive for readout operation. Where a one-bit memory cell is comprised using a flip-flop circuit, at least four FET's are usually required. According to this invention, the addition of four elements to the memory cell provides a 3-bit informaion storable memory cell and in this case it is possible to provide a memory cell having a memory capacity which can be increased by one bit for every two additional elements added to the memory cell. In consequence, where a multi-bit memory cell is constructed, the number of elements required can be reduced to about one half as compared with the conventional memory device.

Figure 4:
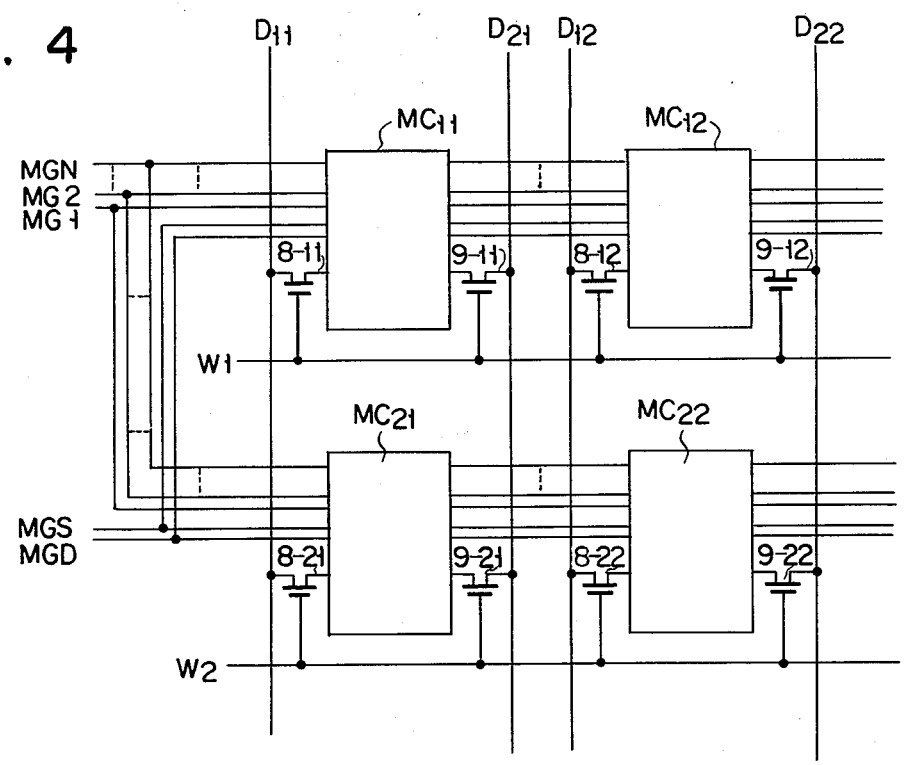
FIG. 4 is a circuit arrangement showing a memory array of a random access memory using the memory cell in FIG. 1.

FIG. 4 is a circuit arrangement showing a 4-bit random access memory (RAM) comprising a matrix array of memory cells in FIG. 1. In FIG. 4, paired digit lines D11, D21 and D12, D22 intersect word lines W1 and W2. Each of memory cells $MC_{11}$, $MC_{12}$, $MC_{21}$ and $MC_{22}$ is arranged at a section defined by the paired digit lines and word line. The gates of FET's 8-11, 8-12, 9-11 and 9-12 are connected to the word line W1 and the gates of the FET's 8-21, 8-22, 9-21 and 9-22 are connected to the word line W2. That is, a pair of digit lines are provided for memory cells in each column and a word line is provided for memory cells in each row. The control lines MG1 to MGN, MGS and MGD for controlling the gates of the FET's constituting the memory cell in FIG. 1 are connected to each memory cell. In the RAM so constructed, N kinds of information are inependently stored by applying a proper bias to the control lines MG1 to MGN, MGS and MGD.

Figure 5:
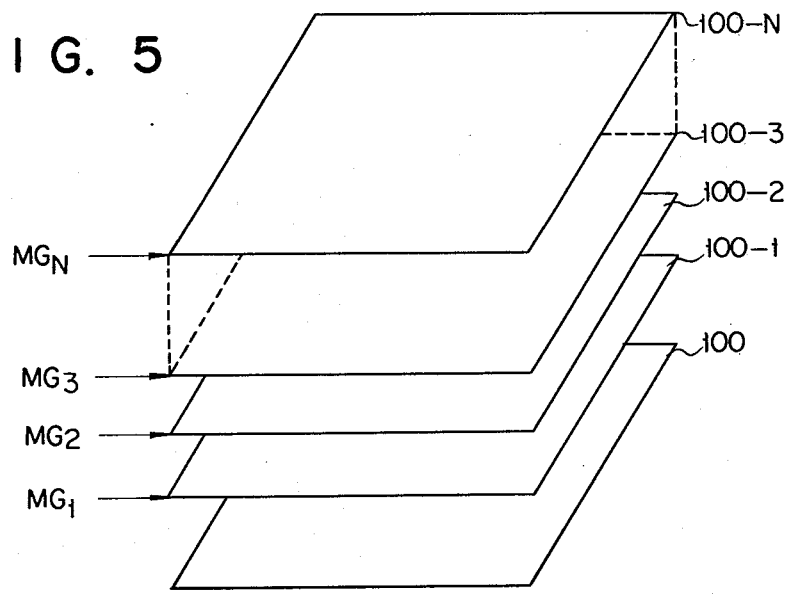
FIG. 5 is an explanatory view for explaining the function of the random access memory in FIG. 4.

FIG. 5 is an explanatory model showing the construction of RAM in FIG. 4. A memory plane area 100 constitutes a volatile memory section constructed by arranging, in a matrix array, flip-flop circuits each comprised of the FET's 1 and 2 in FIG. 1. Nonvolatile memory plane areas 100-1 to 100-N are constructed by arranging memory cell elements in a matrix array so as to correspond to respective ones of the flip-flop circuits in the memory plane area 100. The memory cell elements in th same position of the memory plane areas 100-1 to 100-N correspond to the memory cell elements $M_1$ to $M_N$ described with reference to FIG. 1. The write-in and readout control of the nonvolatile plane areas 100-1 to 100-N is effected by the control lines MG1 to MGN. Information transfer between the volatile memory plane area 100 and the non-volatile memory plane area 100-i is effected through the control lines. In this way, it is possible in the RAM as a whole to process informaion N times the information capable of being processed at the volatile memory plane.

In the memory apparatus according to this invention a variety of information can be stored in those address positions of the nonvolatile memory plane area which correspond to the address position of the volatile memory plane area, and any desired information can be read out through the same address position of the volatile memory plane area. Such a memory apparatus is very advantageously utilized for an information processing device using electronic computers, etc.

In a calculation process by an electronic calculation, a system is usually adopted in which in order to prevent information from being destroyed due to the erroneous operation of the computer a correct data is reserved for each proper time interval and, if any error occurs, data processing can be restarted based on the now previously preserved correct data. For this object the data is transferred from a main memory to an auxiliary memory such as a disc etc. and stored in the latter memory. The data transfer is effected to such a low cost auxiliary memory, which is not used at all times, in an attempt to effectively use the memory space of a high cost main memory. It is necessary, however, that the processing of the computer be stopped during the data transfer.

In the memory apparatus according to this invention, however, information on the volatile memory plane area can be transferred to, and preserved in, any nonvolatile memory plane area merely by controlling the control line connected to the nonvolatile memory plane area. The volatile memory plane area can be successively used for data processing and, if no error is involved in the information processing, fresh information is written through a next check into the non-volatile memory plane area for renewal. If any error is involved in the information processing, a content on the memory plane area is received by a readout control signal and the information processing is again restarted. In this way, the memory apparatus according to this invention obviates the necessity of effecting any complicated information transfer between the main and auxiliary memories.

It is also possible to store a different subroutine program, such as a function subroutine, in each nonvolatile memory plane area and read out the subroutine on the volatile memory plane as required. The memory apparatus according to this invention permits memory programs to be stored in a limited memory space.

It is to be noted that this invention is not restricted to the above-mentioned embodiment. For example, the load FET's 5 and 6 can be omitted by properly designing the channel lengths of the switching FET's 3 and 4 and MNOSFET's $M_{11}$ to $M_{1N}$ and MNOSFET $M_{21}$ to $M_{2N}$.

What is claimed is:

1. A nonvolatile memory device comprising:
    an array of nonvolatile memory cells each including a bistable circuit including a power supply terminal, a pair of output terminals, a pair of resistive means connected at one end to said power supply terminal, a pair of driven field effect transistors whose drains are connected to said pair of output terminals, respectively to perform a flip-flop function, and first and second switching field effect transistors respectively connected between said pair of output terminals and said pair of corresponding resistive means;
    a plurality of first variable threshold field effect transistors each connected in parallel with said first switching field effect transistors; and
    a plurality of second variable threshold field effect transistors each connected in parallel with said second switching field effect transistors, said plurality of second variable threshold field effect transistors being the same in number as said plurality of first variable threshold field effect transistors;
    a pair of transfer field effect transistors respectively connected at drains to sid output terminals;
    a plurality of word lines each connected to the gate of said pair of transfer field effect transistors in each row;
    a plurality of paired digit lines each pair of which are connected to the respective sources of said pair of transfer field effect transistors in each column; and
    a plurality of control lines provided in the same number as said plurality of first variable threshold field effect transistors and each connected to the gate of one of said plurality of first variable threshold field effect transistors in each of said nonvolatile memory cells and to the gate of one of said plurality of second variable threshold field effect transistors in each of said nonvolatile memory cells.

2. A nonvolatile memory device according to claim 1 in which said memory cell further includes a field effect transistor connected between the output terminals of said bistable circuit.

3. A nonvolatile memory cell comprising:
    a bistable circuit including a power supply terminal, a pair of output terminals, a pair of resistive means connected at one end to said power supply terminal, a pair of driver field effect transistors whose drains are connected to said pair of output terminals, respectively to perform a flip-flop function, and first and second switching field effect transistors respectively connected between said pair of output terminals and said pair of corresponding resistive means;
    a plurality of first variable threshold field effect transistors each connected in parallel with said first switching field effect transistors;
    a plurality of second variable threshold field effect transistors each connected in parallel with said second switching field effect transistors, said plurality of second variable threshold field effect transistors being the same in number as said plurality of first variable threshold field effect transistors;
    a plurality of control lines provided in the same number as said plurality of first variable threshold field effect transistors and each connected to the gate of one of said plurality of first variable threshold field effect transistors and to the gate of corresponding one of said plurality of second variable threshold field effect transistors; and
    a pair of transfer field effect transistors respectively connected at one terminal to said output terminals.

4. A nonvolatile memory cell according to claim 3, in which said memory cell further includes a field effect transistor connected between the output terminals of said bistable circuit.

* * * * *